(12) United States Patent
Tsironis

(10) Patent No.: US 10,345,370 B1
(45) Date of Patent: Jul. 9, 2019

(54) HYBRID HARMONIC TUNER

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 3 days.

(21) Appl. No.: 15/800,147

(22) Filed: Nov. 1, 2017

Related U.S. Application Data

(60) Provisional application No. 62/415,754, filed on Nov. 1, 2016.

(51) Int. Cl.
| | |
|---|---|
| *G01R 27/04* | (2006.01) |
| *G01R 31/26* | (2014.01) |
| *G01R 31/28* | (2006.01) |
| *H01P 5/04* | (2006.01) |
| *G01R 27/32* | (2006.01) |

(52) U.S. Cl.
CPC ..... *G01R 31/2614* (2013.01); *G01R 31/2822* (2013.01); *G01R 27/32* (2013.01); *H01P 5/04* (2013.01)

(58) Field of Classification Search
CPC ............ G01R 31/2608; G01R 31/26; G01R 31/2621; G01R 31/02; G01R 31/027; G01R 31/2822; G01R 27/06; G01R 27/28; G01R 21/133; G01R 35/005; G01R 1/04; G01R 1/0491; H01P 1/383; H03H 11/30

See application file for complete search history.

(56) References Cited

U.S. PATENT DOCUMENTS

| | | | | |
|---|---|---|---|---|
| 6,674,293 | B1 | 1/2004 | Tsironis | |
| 6,812,714 | B2 * | 11/2004 | Verspecht | G01R 27/28 324/638 |
| 7,034,629 | B2 | 4/2006 | Tsironis | |
| 7,282,926 | B1 * | 10/2007 | Verspecht | G01R 27/32 324/637 |
| 8,786,293 | B1 * | 7/2014 | Tsironis | G01R 27/06 324/613 |
| 8,975,988 | B1 * | 3/2015 | Tsironis | H01P 5/04 333/17.3 |
| 9,213,056 | B1 * | 12/2015 | Tsironis | G01R 31/2621 |

(Continued)

OTHER PUBLICATIONS

"A New Load-pull Characterization Method for Microwave Power Transistors," Y. Takayama, [online], 1976 IEEE Microwave Theory & Techniques Society (MTT-S) International Microwave Symposium, pp. 218-220. [Retrieved on Apr. 6, 2017]. Retrieved from Internet <URL: http://ieeexplore.ieee.org/document/1123701/>.

(Continued)

*Primary Examiner* — Thang X Le

(57) ABSTRACT

A hybrid harmonic tuner uses a reverse injection technique, a modified adjustable Gamma Boosting Unit (GBU) cascaded with a passive multi-carriage harmonic impedance tuner in the same slabline and housing. The GBU samples a portion of the forward travelling signal at the fundamental frequency, adjusts its phase and amplitude, amplifies it and injects it back, in reverse direction into the main signal path. In the hybrid tuner technique, as is herein implemented, the forward coupler (wave-probe) is mounted on the vertical axis of a slide screw tuner-type carriage and, being horizontally and vertically controlled, it eliminates the need of a separated phase shifter and attenuator, which makes the solution better, simpler and more effective; harmonic tuning is performed using only the multi-carriage passive tuner.

10 Claims, 15 Drawing Sheets

(56) References Cited

U.S. PATENT DOCUMENTS 9,331,670 B1    5/2016   Mahmoudi et al.
2013/0321092 A1*  12/2013  Simpson ............... H03H 11/30
                                                  333/17.3
2014/0167793 A1*  6/2014  Vanden Bossche .........................
                                                  G01R 31/2839
                                                  324/750.01

OTHER PUBLICATIONS

"Active Load Pull System, ALPS", Product Note 33, Focus Microwaves, 1966, p. 3, Figure 3.
"Computer-Aided Error Correction of Large-Signal Load-Pull Measurements", Tucker, R.S. and BR Adley P., [online], IEEE Transactions on Microwave Theory and Techniques, vol. MTT-32, No. 3, Mar. 1984, pp. 296-300. [Retrieved Apr. 6, 2017]. Retrieved from Internet < URL: http://ieeexplore.ieee.org/document/1132668/>.
"Comparison of Active Versus Passive On-wafer Load-pull Characterization of Microwave and Millimeter-wave Power Devices," J. E. Muller and B. Gyselinckx, [online],1994 IEEE MTT-S Digest, CH3389-4/94/0000-1007$01.00, pp. 1007-1080, Figure 1, [Retrieved Apr. 6, 2017]. Retrieved from Internet < URL: http://ieeexplore.ieee.org/iel5/1100/7886/00335168.pdf>.
"MPT, a Universal Multi-Purpose Tuner, Product Note 79", Focus Microwaves Inc., Oct. 2004.
"Multi Port Measurements", presentation by, D. Blackham and K. Wong, Agilent Technologies. pp. 3-8.

\* cited by examiner

FIG. 7: prior art, (see FIG. 3)

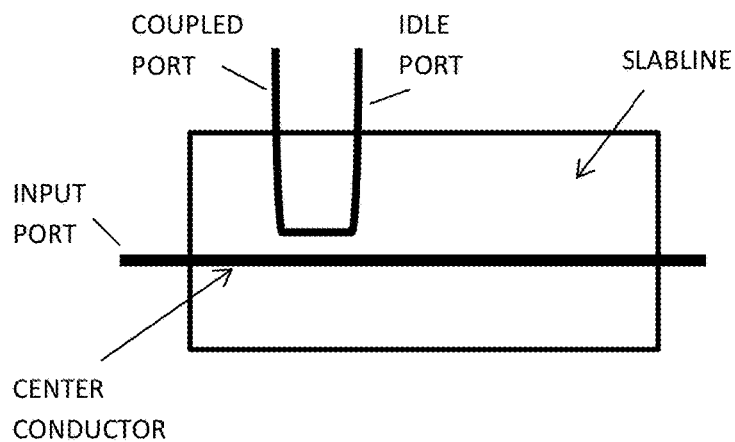
FIG. 15A: Prior art
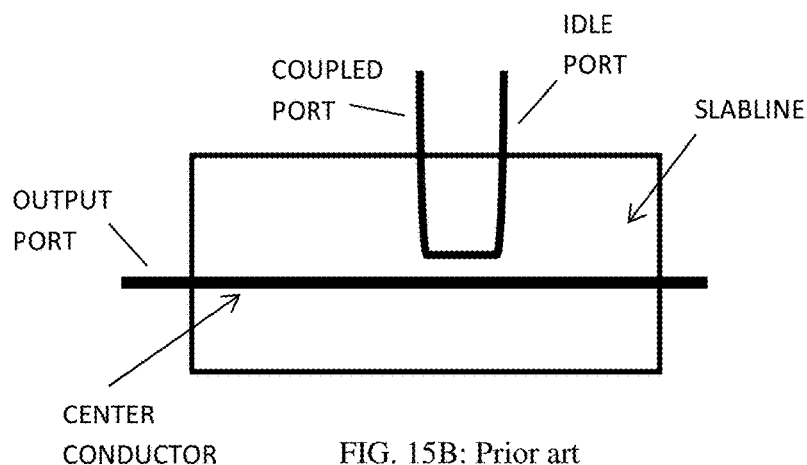
FIG. 15B: Prior art
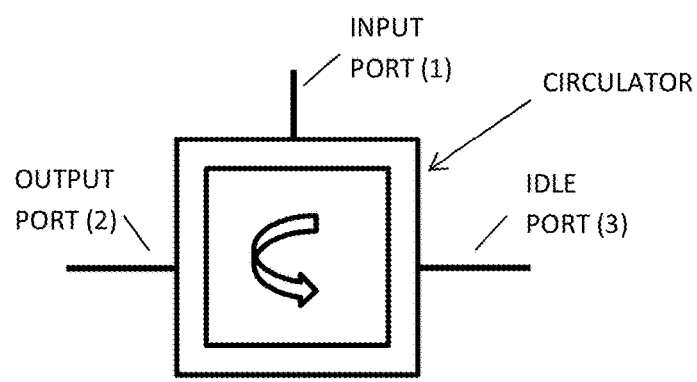
FIG. 15C: Prior art

US 10,345,370 B1

HYBRID HARMONIC TUNER

PRIORITY CLAIM

This application claims priority on provisional application 62/415,754 titled "Hybrid Harmonic Tuner", filed on Nov. 1, 2016.

CROSS-REFERENCE TO RELATED ARTICLES

1. "A New Load-pull Characterization Method for Microwave Power Transistors," Y. Takayama, [online], 1976 IEEE Microwave Theory & Techniques Society (MTT-S) International Microwave Symposium, pp. 218-220. [Retrieved on 2017 Apr. 6]. Retrieved from Internet <URL: http://ieeexplore.ieee.org/document/1123701/>.
2. "Active Load Pull System, ALPS", Product Note 33, Focus Microwaves, 1966, page 3, FIG. 3.
3. "Computer-Aided Error Correction of Large-Signal Load-Pull Measurements", TUCKER, R. S. and BRADLEY P., [online], IEEE Transactions on Microwave Theory and Techniques, vol. MTT-32, No. 3, March 1984, pp. 296-300. [Retrieved 2017 Apr. 6]. Retrieved from Internet <URL: http://ieeexplore.ieee.org/document/1132668/>.
4. "Comparison of Active Versus Passive On-wafer Load-pull Characterization of Microwave and Millimeter-wave Power Devices," J. E. Muller and B. Gyselinckx, [online], 1994 IEEE MTT-S Digest, CH3389-4/94/0000-1007$01.00, pp 1007-1080, FIG. 1, [Retrieved 2017 Apr. 6]. Retrieved from Internet <URL: http://ieeexplore.ieee-.org/iel5/1100/7886/00335168.pdf>.
5. Mahmoudi et al., U.S. Pat. No. 9,331,670, "Gamma Boosting Unit (GBU) for Hybrid Load and Source Pull"
6. "MPT, a Universal Multi-Purpose Tuner, Product Note 79", Focus Microwaves Inc., October 2004.
7. "Multi Port Measurements", presentation by, D. Blackham and K. Wong, Agilent Technologies. Pages 3-8.
8. Verspecht et al., U.S. Pat. No. 7,282,926 "Method and an apparatus for characterizing a high-frequency device-under-test in a large signal impedance tuning environment".
9. Tsironis C, U.S. Pat. No. 6,674,293, "Adaptable Pre-matched Tuner System and Method".
10. Tsironis. C., U.S. Pat. No. 7,034,629, "High frequency, high reflection pre-matching tuners with variable zero initialization"

BACKGROUND OF THE INVENTION

This invention relates to high power testing of microwave transistors (DUT) in nonlinear operation, where the signal form is distorted and harmonic signal components are generated and must be processed. When the transistor is driven in its nonlinear operation regime, the internal impedance at the output of power transistors is very low. An impedance tuner used to match the transistor must also match such impedance. Passive impedance tuners can reach maximum reflection factors tuner $|\Gamma_{tuner}|$ of the order of 0.95, corresponding to impedances of 2.4Ω. The insertion loss between DUT and tuner reduces the available tuning range at the DUT reference plane and thus the capacity of the passive tuner to match the transistor. The only remedy to this limitation is using active systems, i.e. test systems whereby a signal coherent with the signal injected into the transistor, is injected independently into the DUT output terminal and creates a virtual load. This additional signal can be the only one injected, in which case we speak of "active" load pull, or is can be superimposed to signal reflected by a passive tuner, in which case we speak of "hybrid" load pull; obviously if only a passive tuner is present, we speak of "passive" load pull. In both active injection cases the objective is reaching and conjugate matching the internal impedance of the transistor; in general terms a standard requirement is a dynamic range reaching a reflection factor $|\Gamma|=1$ (corresponding to an internal impedance of 0Ω). The objective of this invention is an active tuner apparatus, combining a modified reverse signal injection mechanism within a tuner architecture allowing $|\Gamma|=1$. Harmonic signal components are processed (matched with proper loads) using passive harmonic (20, 23) tuners. The typical test system is shown in FIG. 1:

A four port vector receiver (24, VNA), injects signal (25) into the DUT (21) via a source tuner (23), which is wideband or harmonic and a bidirectional coupler (11). The outgoing signal travels through a second bidirectional coupler (10) and a load harmonic tuner (20) which is terminated with characteristic impedance Zo (19), typically 50Ω. The injected and reflected power waves <a> and <b> into and from the DUT are measured by the VNA (24), after being sampled by the couplers (10, 11). The tuners and instruments are controlled digitally (18, 17) by a system controller (22) running appropriate test software.

DESCRIPTION OF PRIOR ART

There have been a number of attempts to create active load pull systems, starting back in the 70'ies (see ref. 1 to 4). Such load pull techniques use the so called "virtual load" method. The virtual load method consists in injecting into the output of the DUT RF signal power at the same frequency as traversing the DUT from the input to the output, but with controlled phase and amplitude. Knowing that the reflection factor "seen" by the DUT is equal to the ratio of returned (reflected) power wave <a> to primary output power wave <b>: (r=<a>/<b>), see FIG. 14, it is obvious that, if <b> is constant, as it is if the DUT and the injected power at its input port do not change, by controlling the phase and amplitude of <a> we can control Γ. There are a number of ways to do this: One is to use an "active load" technique (see ref. 2). In this case part of the outgoing power $P_{out}$ is split into a directional coupler, filtered, phase adjusted and amplified and re-injected into the output port of the DUT, which will "see" a complex load Γ as described above. Another method is to use a split signal (see ref. 1) or two synchronized RF sources (see ref. 3) one to inject RF power into the input of the DUT and one into its output. Since the sources are synchronized they can generate a coherent signal and if we adjust the relative phases between sources and the amplitude of the second source, then the DUT will, again, see at its output port a "virtual" load F, as described earlier.

The concept used in this invention is combination of passive multi-carriage harmonic tuning, see ref. 6, with a modified version of the forward injection technique, also called Gamma Boosting Unit (GBU), FIG. 2, see ref. 5. In the original version the GBU samples a portion of the reflected travelling signal (port 2 in FIG. 2), adjusts its phase using a phase shifter (φ), adjusts its amplitude (attenuation (τ)), amplifies it, and couples it back into the DUT (port 1 in FIG. 2), in reverse direction into the signal coming out of the DUT. The new way this concept is employed in this invention, though, uses the forward coupling technique as an active feedback loop, whereby the outgoing signal from the DUT is sampled and amplified, before it is reflected by the passive tuner, and is injected back into the DUT, synchronous with the reflected signal either before (FIG. 13) or after (FIG. 14) the passive tuner. The present implementation eliminates the need of both the phase shifter φ and the attenuator τ in FIG. 2, which are an important hardware limitation; this creates a better, simpler and more effective solution and allows integrating with an impedance tuner in the same slabline with minimum transition loss. Tuning at the harmonic frequency is passive only, created using the passive slide screw tuner following the GBU (FIG. 5).

BRIEF DESCRIPTION OF THE SEVERAL VIEWS OF THE DRAWINGS

The invention and its mode of operation will be more clearly understood from the following detailed description when read with the appended drawings in which:

FIG. 15A through FIG. 15B depicts prior art, the definitions of ports in couplers and coupling devices: FIG. 15A depicts the port definitions in the coupler #1 (wave-probe); FIG. 15B depicts the port definitions of the wave-probe used as injection coupling device; FIG. 15C depicts the port definitions of a circulator used as an injection coupling device.

DETAILED DESCRIPTION OF THE INVENTION

Figure 1:
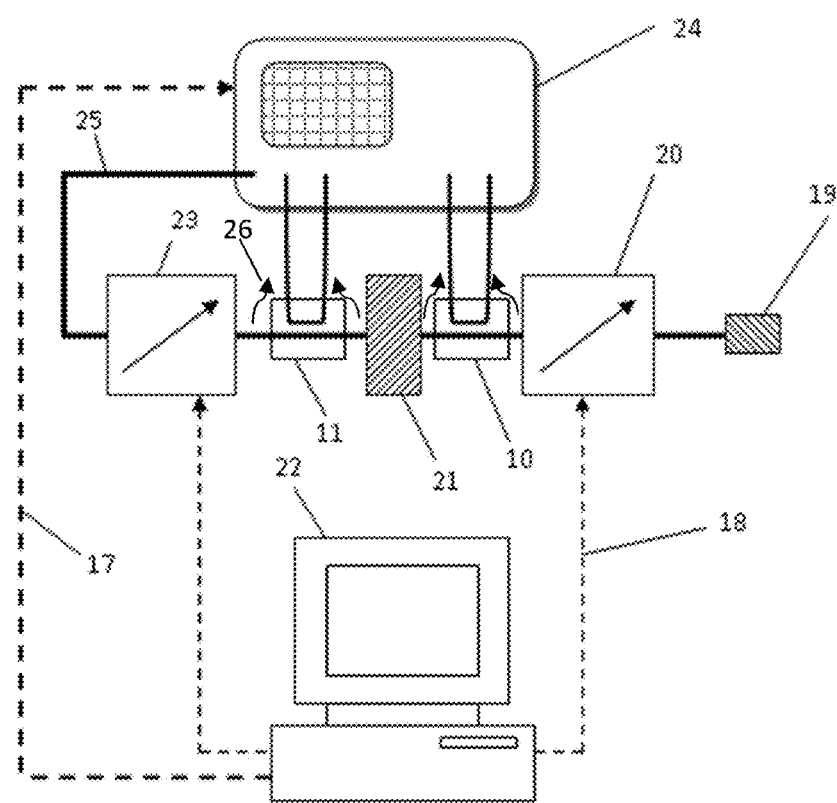
FIG. 1 depicts prior art, a load pull system allowing measuring injected and reflected power waves and harmonic signal components.
Figure 2:
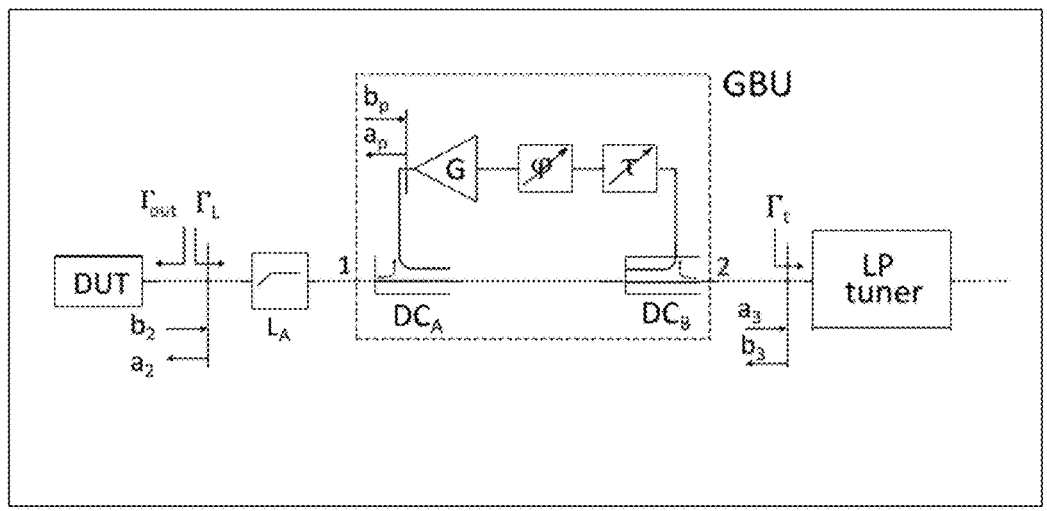
FIG. 2 depicts prior art, the Gamma Boosting Unit, a forward coupling active injection system, (see ref. 1).
Figure 3:
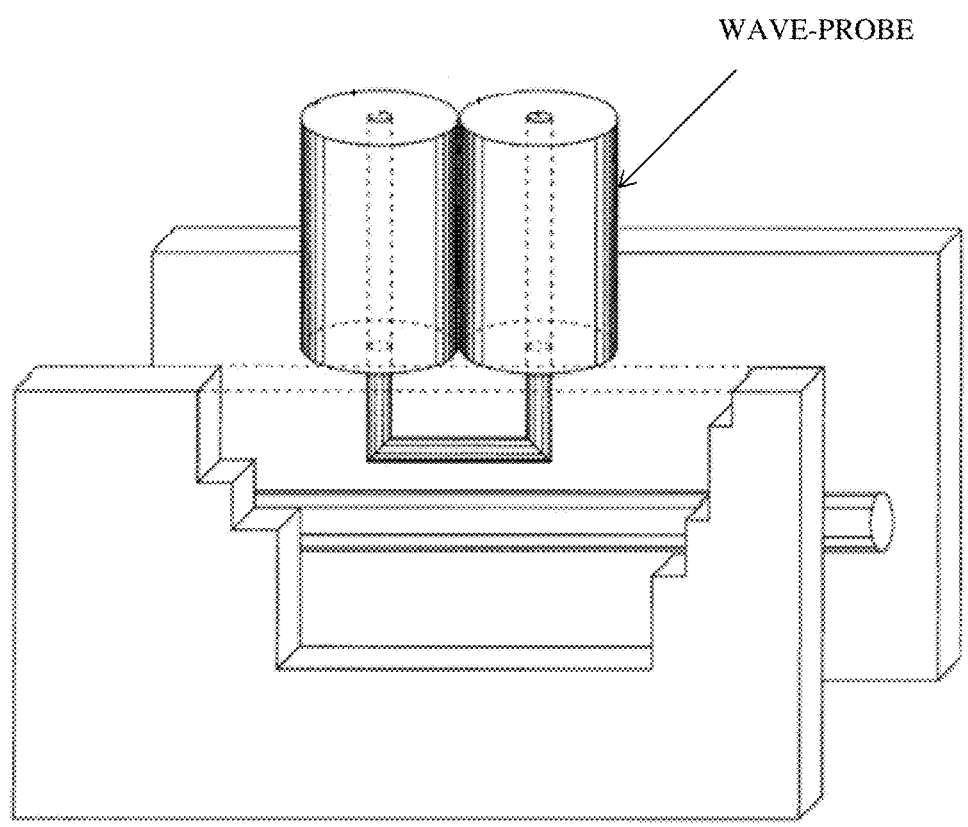
FIG. 3 depicts prior art, a compact signal coupler using a folded semi-rigid coaxial cable, ("wave-probe", see ref. 8).
Figure 4:
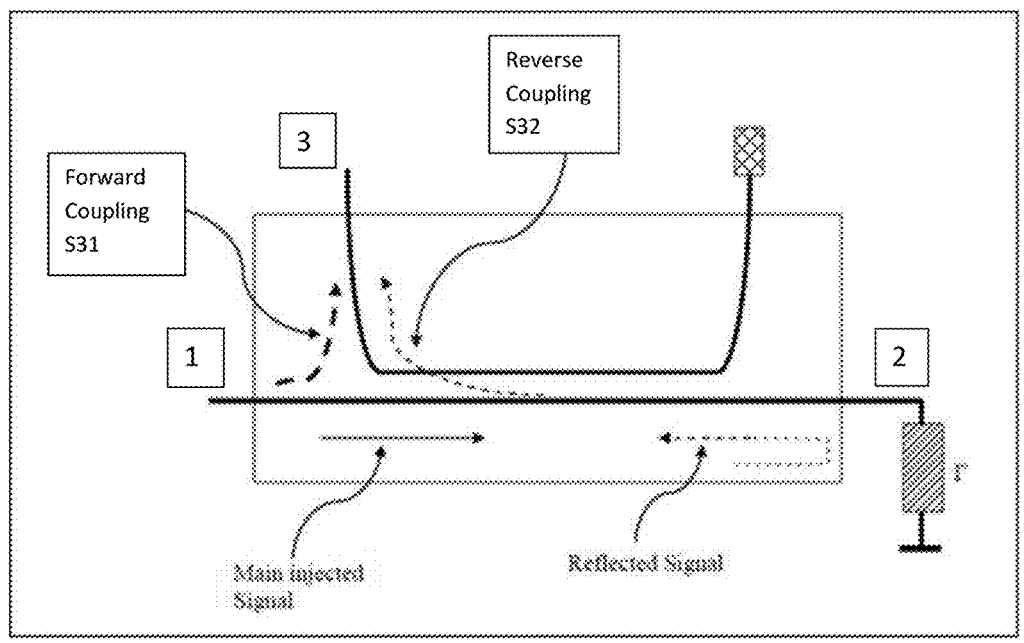
FIG. 4 depicts prior art, signal flow definitions in a directional coupler, (see ref. 3).
Figure 7:
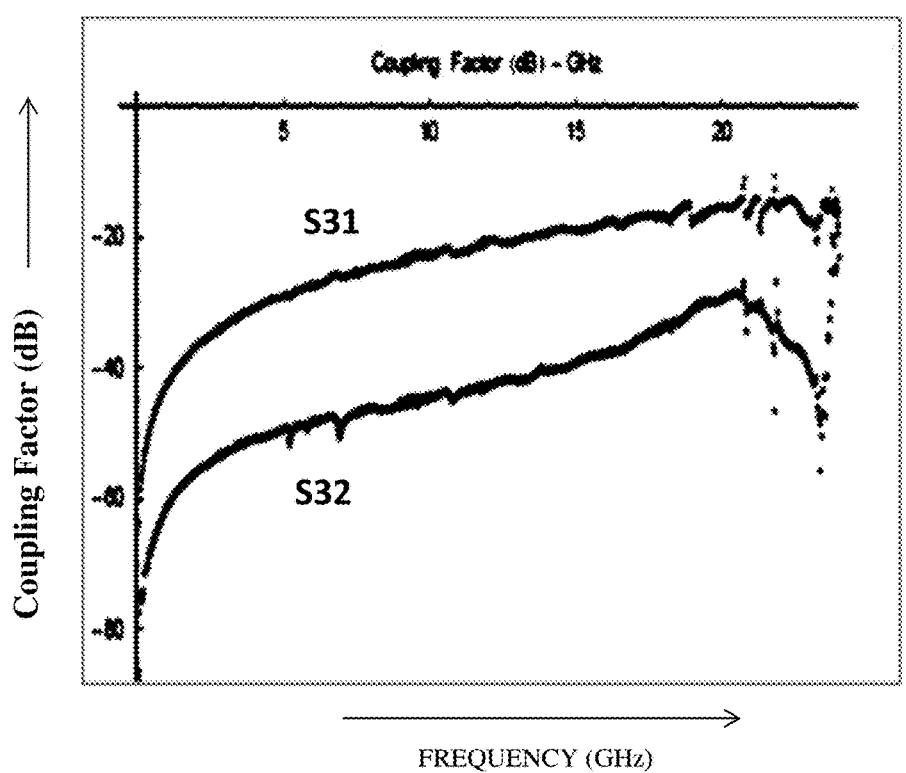
FIG. 7 depicts measurement of forward and reverse coupling of a signal coupler (wave-probe) as depicted in FIG. 3, as a function of frequency.
Figure 8:
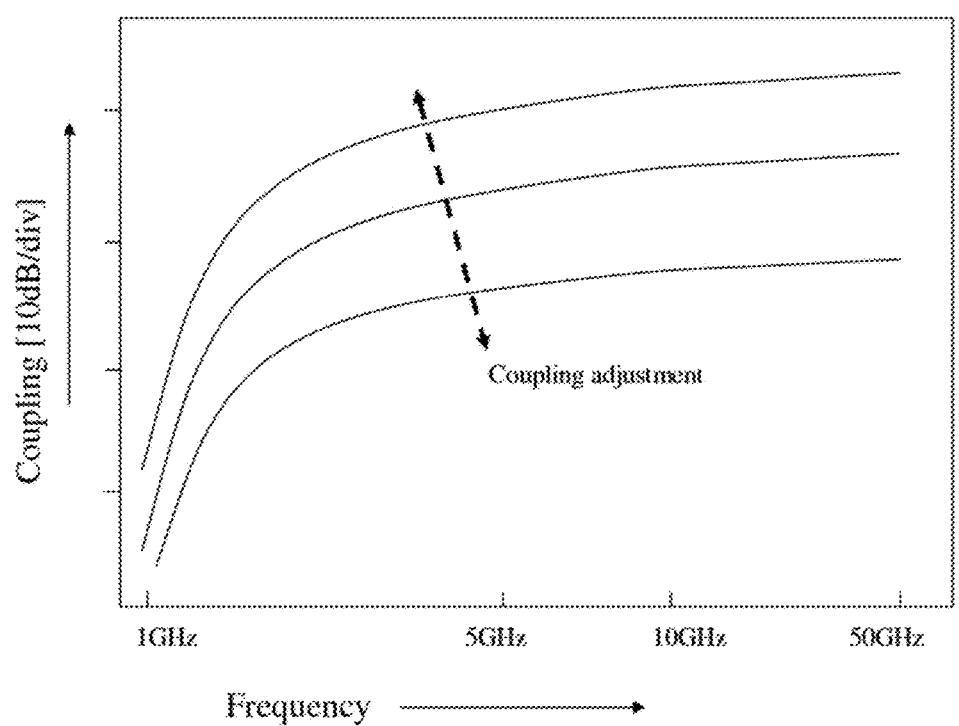
FIG. 8 depicts variation of coupling factor (S31) as a function of proximity of coupler to center conductor (probe depth) and frequency.

The concept of the hybrid harmonic impedance tuner is shown in a number of embodiments in FIGS. 5, 6 and 9 to 11. In all embodiments a compact directional coupler is used, the "wave-probe" (see ref. 8) which is mobile, wideband, has sufficient Directivity (S31(dB)-S32(dB), related to the Isolation of the non-coupled port) and can be easily mounted on the vertical axis of the carriage of a tuner, instead of the reflective tuning probe (FIGS. 3, 4 and 7); by lowering the wave-probe into the slabline from the top, the coupling factor can be adjusted (FIG. 8); by moving the carriage horizontally along the slabline, the phase of the coupled signal can be adjusted as well. In a first embodiment, FIG. 5, a first mobile carriage (503) has an adjustable vertical axis (52), controlled by stepper motor (504), which carries a compact directional coupler (wave-probe) (51) having a coupled port (507) and an isolated port (506), both ports being fixed on the tuner housing (55) and connected with the wave-probe (51) using flexible cable (505). The carriage (503) is placed closest to the test port (50) and moves along the slabline (508). A second directional coupler (wave-probe) (53) is mounted between the first coupler (51) and the passive tuner, defined as the section between the separation (509) and the idle port (511). The second coupler (53) is typically fixed and provides a given coupling factor of the amplified signal entering in port (501). Ports (502 and 506) are terminated with characteristic impedance (Zo). The passive tuner comprises two (see ref. 9) or more mobile carriages holding one or more wideband reflective (tuning) probes (500, 510) each; the probes are attached to the vertical axes of the carriages and their penetration inside the slabline (508) and capacitive coupling with the center conductor (54) is controlled using stepper motors (58, 59). All carriages are controlled horizontally independently on each-other using lead screws (57) or other gear and additional stepper motors, a technique known in prior art (see ref. 10) and not shown herein in more detail. Appropriate tuning algorithms allow two wideband tuning probes independent tuning at two frequencies (harmonic or not) and three probes at three frequencies (see ref. 6). The vertical separations (509, 56) indicate, symbolically, the fact that each carriage is movable horizontally independently and does not necessarily mean a physical separation. The predominant reason for avoiding physical separation walls is that any such walls would have to be placed at a minimum distance from the test port and from each-other corresponding to half a wavelength at the minimum frequency and thus wasting tuning area at higher frequencies (see ref. 10), due to insertion loss in the slabline.

The adjustability of coupler (51) is not absolutely necessary during dynamic (mechanical) tuning operations. It is mainly required in order to statically boost the reflected signal at the passive tuner ($\Gamma_1$ in FIG. 13) by adding an adjustable, but kept fixed during dynamic tuning, power wave vector (<b*G*C1*C2>) which is "in-phase" with Fi at the fundamental frequency (Fo); this is only possible if the phase of C1 is adjustable, which is obtained using the adjustable wave-probe (51); in that sense the reverse active injection works as a static "active pre-matching" signal component. For that a full automation of the wave-probe control is not mandatory. The carriage (503) and axis (52) can also be manually controlled using micrometric screws and gear. In actual operation the coupling factor and phase would be once manually set, remain fixed, and allow tuning using the passive tuner around the prematching active power wave vector <b*G*C1*C2> in FIG. 13, or <b*G*S21.C*S21.T> in FIG. 14. The used port definitions of the coupler (51) and the injection coupling device (53) either in form of a static wave-probe or in form of a circulator (FIGS. 10 and 14) are shown in FIGS. 15A through 15C.

Figure 5:
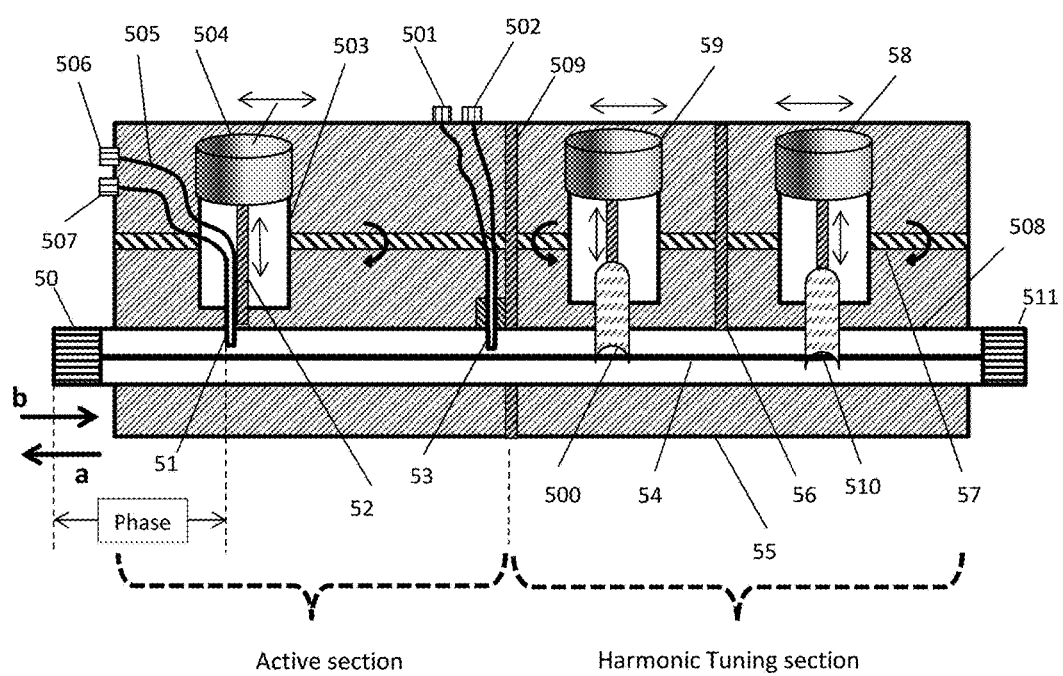
FIG. 5 depicts front view of a first embodiment of hybrid (active-passive) harmonic tuner, with adjustable phase feedback injection (53) before the tuner.
Figure 6:
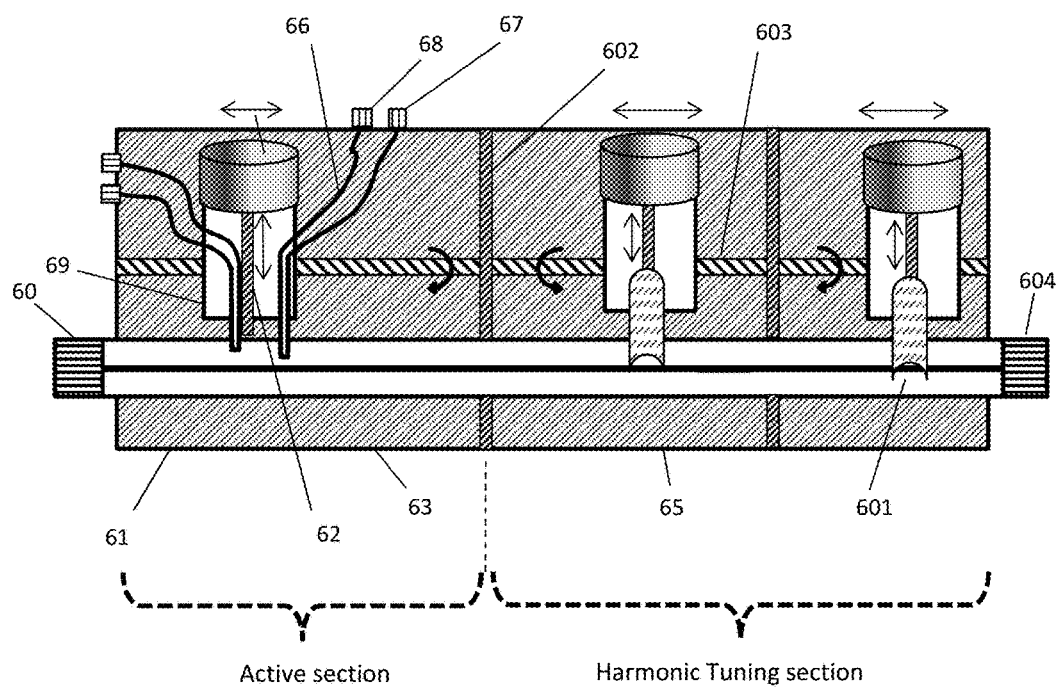
FIG. 6 depicts front view of a second embodiment of hybrid harmonic tuner.
Figure 9:
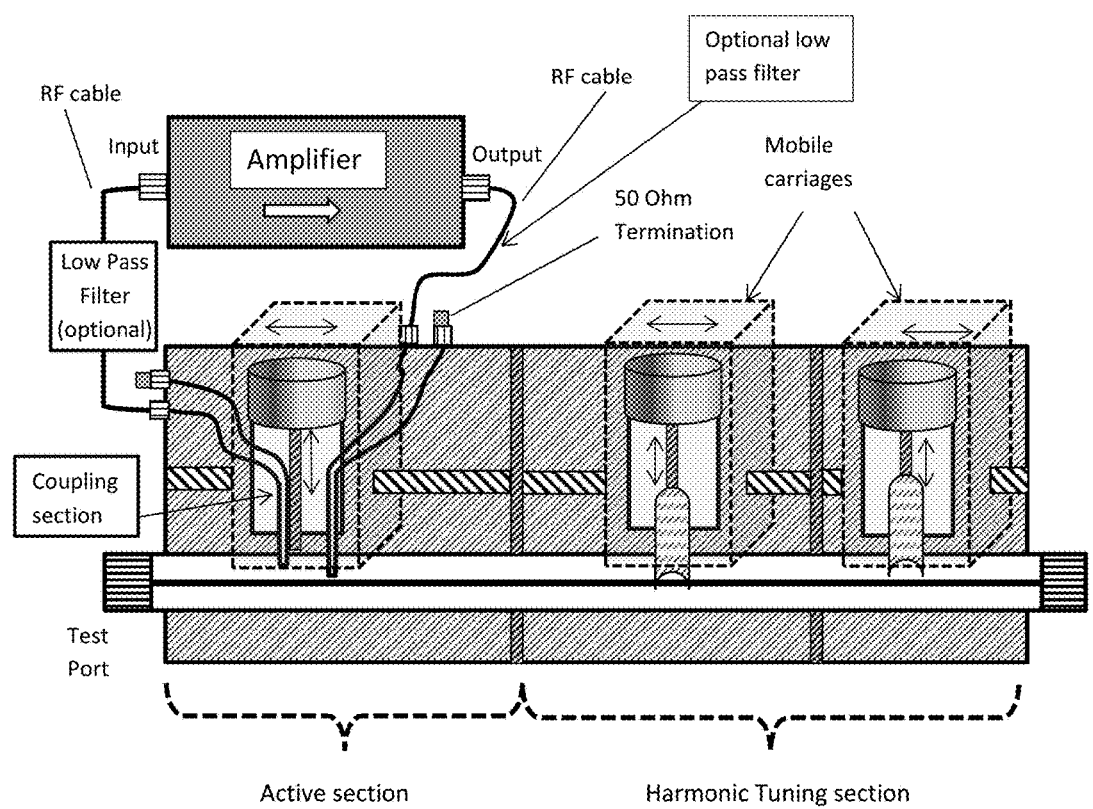
FIG. 9 depicts a complete hybrid harmonic slide screw tuner, comprising the tuning section, the coupling section and the amplifier, with fixed phase feedback injection before the tuner.

A slightly different embodiment is depicted in FIG. 6; all components are the same as in the embodiment of FIG. 5, except that the second coupler (wave-probe) (63) is now mounted on the mobile carriage (69) closest to the test port (60) and at an appropriate phase relative to the first wave-probe (61), which is mounted on the vertical axis (62). The second wave-probe (63) is connected with fixed coaxial connectors (68) and (67) using flexible RF cables (66). Adjustability of the phase is more difficult in this configuration and the frequency band is restricted. However the advantage is that the section between the carriage (69) and the separation (602) is reduced and this offers advantages at high frequency harmonic tuning using probes (65) and (601). Phase adjustability can be reached by properly choosing the length of the RF cables to and from the external amplifier (FIG. 9). All carriages are moved horizontally using independently controlled lead screws (603). The passive tuner is mounted closer to the idle port (604).

The complete hybrid harmonic tuner is depicted in FIG. 9: It comprises the active section, including the external power amplifier and the passive harmonic tuning section, which comprises, in this Figure, two independent mobile carriages and tuning probes. Horizontal motors and electronic control boards are, again, not shown for simplicity reasons, but are known from prior art and implied here. The optional low pass filter, inserted before the amplifier allows pure fundamental frequency operation of the amplifier, in case the harmonic signals generated by the DUT exceed a certain level and are coupled by the wideband wave-probe (see FIG. 7) into the amplifier path; additionally or alternatively a low pass filter can be inserted between the output port of the amplifier and the coupling device or circulator (FIGS. 9, 10 and 11) to suppress any harmonic signal components generated by the amplifier, if it is driven into compression.

Figure 10:
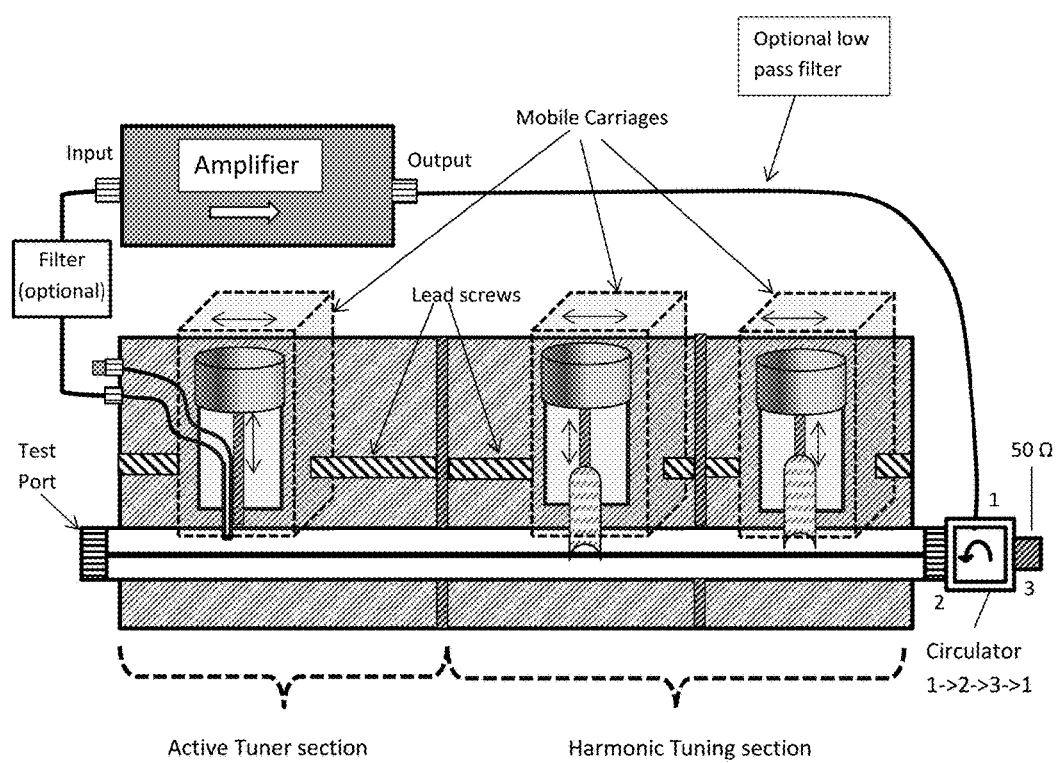
FIG. 10 depicts a third embodiment of hybrid harmonic tuner using a circulator to inject the feedback signal after the tuner and with adjustable phase.
Figure 13:
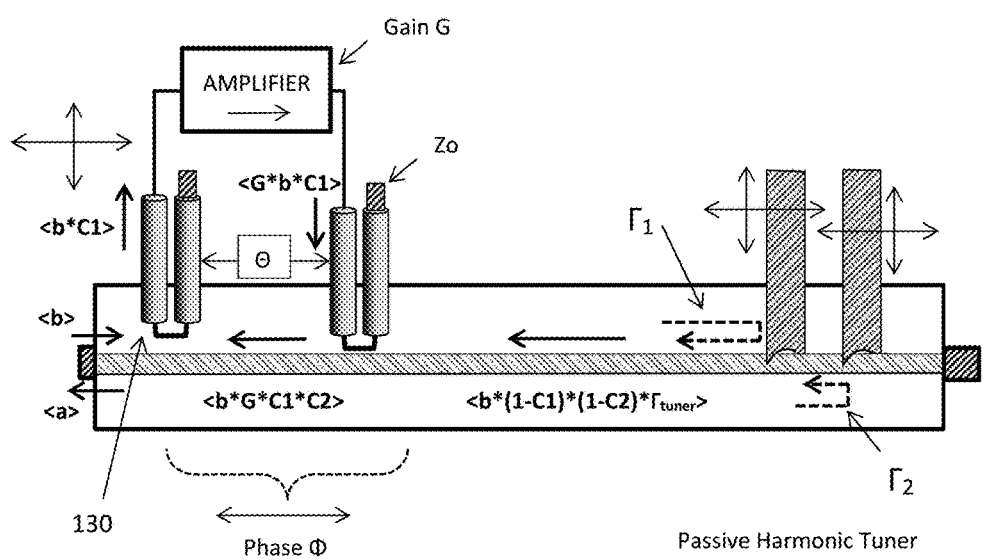
FIG. 13 depicts schematic signal flow in hybrid tuner as in embodiment of FIG. 9.
Figure 14:
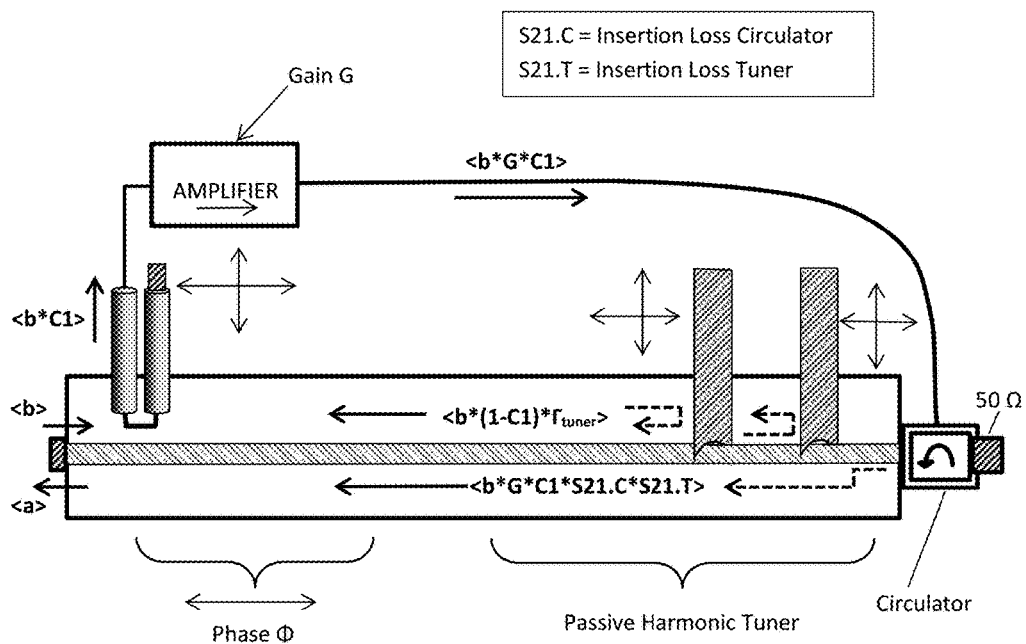
FIG. 14 depicts schematic signal flow in hybrid tuner as in embodiment of FIG. 10.

A different embodiment is depicted in FIG. 10: In this case the coupling device (wave-probe) (53), (63) is replaced entirely by a circulator, cascaded with the idle port of the tuner. The amplified signal from the amplifier is injected into port 1 of the circulator and exits from port 2 (compare also with FIG. 14); the insertion loss of the circulator (S21.C) is very small, typically 0.1 to 0.2 dB allowing almost 98% of the injected power to be transferred. However, the injected signal will be (a) reflected backwards (towards the circulator) by the passive tuner and (b) it will be attenuated by the insertion loss (S21.T) of the passive tuner itself. Since the passive tuner is a reciprocal component, it must be noticed that S21.T=S12.T, whereas this is not valid for the circulator (S21.C≠ S12.C), which is non-reciprocal. Instead the signal reflected backwards at the tuner is transferred from port 2 to port 3 and absorbed by the 50Ω termination (or the power meter). Signal and power wave transfers in both basic hybrid tuner embodiments are shown in FIG. 13 (for embodiments 1 and 2, in FIGS. 5, 6 and 14 (for embodiment 3 in FIG. 10). In the case of embodiments 1 and 2 the reflected signal (real and virtual) can be approximated by: $<a>=<b*G*C1*C2>+<b*(1-C1)*(1-C2)*\Gamma_{tuner}>$ and in the case of embodiment 3 by $<a>=<b*(1-C1)*\Gamma_{tuner}>+<b*G*C1*S21.C*S21.T>$. Considering that the reflection factor presented to the DUT $\Gamma_{load}=<a>/<b>$ then it is obvious that the reflection factor magnitude $|\Gamma_{load}|$ can be made >1 by appropriately choosing G, C1 and the phases of the power waves, especially for realistic values of passive $|\Gamma_{tuner}|<1$. The phases are adjustable by appropriate positioning the tuner carriages horizontally along the slabline. In FIG. 13, the phase Θ between the first and second coupler determines the magnitude of the injected signal at the entry position of the first coupler (130), whereas the actual position of the first carriage carrying the wave-probe determines the phase Φ of the injected signal relative to the signal reflected at the passive tuner.

It must be noticed that the reflection factor created by the multi-carriage tuner at the fundamental frequency (and the harmonic frequencies as well) is the superposition of individual reflections $\Gamma_1$ and $\Gamma_2$. This allows harmonic tuning as well by combining the vectors through appropriate algorithms and numeric search (see ref. 6).

Figure 11:
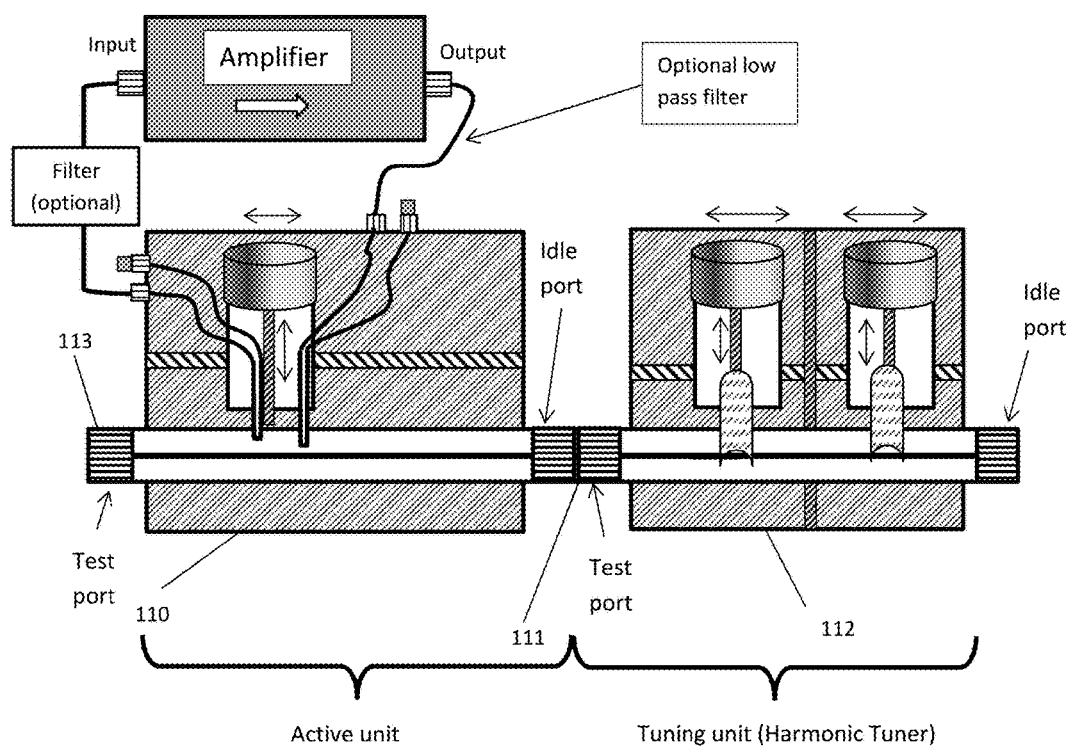
FIG. 11 depicts a fourth embodiment of hybrid harmonic tuner, whereby the passive harmonic tuner is a separate unit.

An alternative embodiment is depicted in FIG. 11: in this case the passive tuner (112) is a unit separated from and cascaded with the active unit (110). Otherwise the concept is the same as outlined before. Though this configuration offers some flexibility and simplifies assembly and tuner alignment it suffers from additional insertion loss at the area of the interconnection (111) between the units, reducing the effective tuning range of the passive tuner and creating additional requirement for available power from the amplifier. As before, the active block (110) is inserted between the test port (113) and the passive tuner (112).

Figure 12:
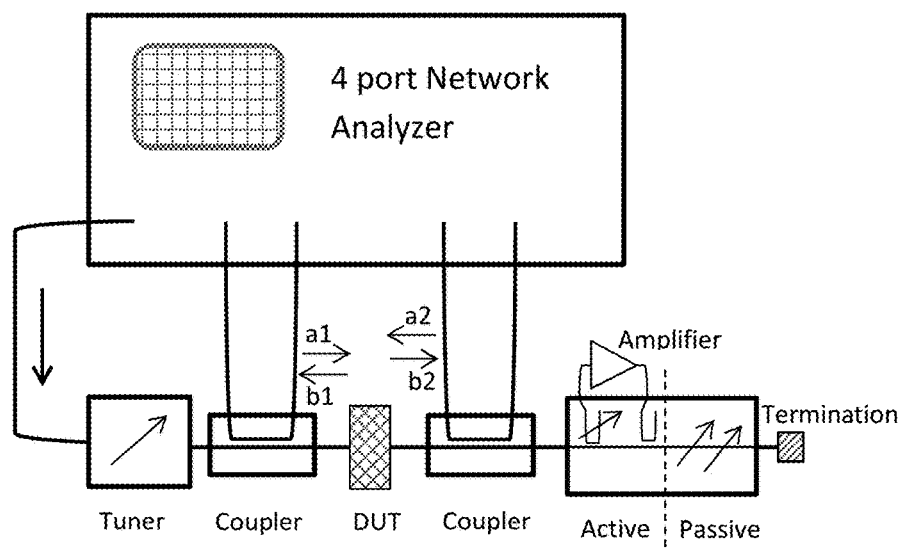
FIG. 12 depicts a load pull measurement system using hybrid harmonic tuner.

Active injection networks cannot be pre-calibrated, i.e. their s-parameters cannot be measured, saved, recalled and used under varying input power test conditions. The reason is that the amplifier will become nonlinear at certain power level, causing a Gain change or a phase distortion, in which case the calibration is lost. Such networks shall be used in load pull networks with on-line wave measurement capability (see ref. 7). FIG. 12 depicts such a load pull test system using hybrid harmonic tuner. The 4-port network analyzer is a harmonic receiver: it measures injected and reflected power waves through the two couplers and, using proper calibration, corrects them back to the DUT reference plane. Fundamental and harmonic power waves, power, gain and impedances presented to the DUT can be measured, associated and saved with the DUT characteristics in load pull data files.

Obvious alternative embodiments of the concept of combining active feedback power injection with passive harmonic tuners to create a hybrid harmonic tuner are imaginable but shall not impede on the originality of the present invention.

What I claim as my invention is:

1. A hybrid harmonic impedance tuner comprising
an active fundamental frequency impedance tuner including an adjustable directional coupler having an input port, a coupled port and an idle port, a power amplifier having an input port and an output port, an injection coupling device having a coupled port, an output port and an idle port, and characteristic impedance (Zo) terminations;
a passive harmonic frequency impedance tuner including a slabline (slotted airline) having an input test port and an output idle port, a center conductor and two or more mobile carriages sliding independently horizontally along the axis of the slabline and having one or more vertically movable axes each, each said axis carrying a reflective tuning probe; and wherein
the coupler is integrated in the slabline and placed between the input test port and the mobile carriages of the passive harmonic frequency impedance tuner and is sampling signal power from the slabline; the coupled port of the coupler is connected to the input port of the amplifier; the output port of the amplifier is connected to the coupled port of the injection coupling device of which the output port is connected to the output port of the slabline.

2. The tuner as in claim 1, wherein the injection coupling device is a fixed wave-probe, which is placed between the coupler and the mobile carriages of the passive harmonic frequency impedance tuner, and is integrated in the slabline and coupled with the center conductor.

3. The tuner as in claim 1, wherein the injection coupling device is a circulator, having three ports, a coupled port 1, an output port 2 and an idle port 3, wherein the coupled port 1 is connected to the output port of the amplifier, the output port 2 is connected to the idle port of the slabline and the idle port 3 is terminated with characteristic impedance (Zo), and wherein signal flow in the circulator is from port 1 to port 2, from port 2 to port 3 and from port 3 to port 1.

4. The tuner as in claim 2, wherein the coupler is attached to the movable vertical axis of a mobile carriage, said carriage moving horizontally along the slabline, between the input test port and the injection coupling device.

5. The tuner as in claim 4, wherein the horizontal movement of the mobile carriages and the movement of the vertical axes are automated, remotely controlled using stepper motors, appropriate gear, control electronics and software.

6. The tuner as in claim 4 wherein the horizontal mobile carriage and vertical axis movement of the passive harmonic frequency impedance tuner are automated, remotely controlled using stepper motors, appropriate gear, control electronics and software;

and wherein the horizontal and vertical movement of the coupler are manually adjustable using micrometric screws and gear.

7. The tuner as in claim 6, wherein the horizontal movement of the mobile carriage carrying the coupler is automated and whereas the vertical axis holding the coupler is manually adjustable using micrometric screw and gear.

8. The tuner as in claim 1, wherein the active fundamental frequency impedance tuner and the passive harmonic frequency impedance tuner are separate cascaded units, wherein each unit has an input test port and an output idle port and wherein the idle port of the active fundamental frequency impedance tuner is connected to the test port of the passive harmonic frequency impedance tuner.

9. The tuner as in claim 1, wherein a low pass filter is inserted between the coupling port of the coupler and the input port of the amplifier.

10. The tuner as in claim 1, wherein a low pass filter is inserted between the output port of the amplifier and the coupling port the injection coupling device.

* * * * *